US008710840B2

(12) United States Patent
Gross et al.

(10) Patent No.: US 8,710,840 B2
(45) Date of Patent: Apr. 29, 2014

(54) METHOD AND SYSTEM FOR PHASE-SENSITIVE MAGNETIC RESONANCE IMAGING

(75) Inventors: Patrick Gross, Langensendelbach (DE); Antje Kickhefel, Erlangen (DE); Joerg Roland, Hemhofen (DE)

(73) Assignee: Siemens Aktiengesellschaft, Munich (DE)

( * ) Notice: Subject to any disclaimer, the term of this patent is extended or adjusted under 35 U.S.C. 154(b) by 315 days.

(21) Appl. No.: 13/216,505

(22) Filed: Aug. 24, 2011

(65) Prior Publication Data

US 2012/0049846 A1  Mar. 1, 2012

(30) Foreign Application Priority Data

Aug. 24, 2010  (DE) .................... 10 2010 039 693

(51) Int. Cl.
 *G01V 3/00* (2006.01)
(52) U.S. Cl.
 USPC .......................................................... 324/309
(58) Field of Classification Search
 USPC ................................................. 324/300–322
 See application file for complete search history.

(56) References Cited

U.S. PATENT DOCUMENTS

| 4,649,346 | A | | 3/1987 | Yeung et al. | |
|---|---|---|---|---|---|
| 4,684,891 | A | * | 8/1987 | Feinberg | 324/309 |
| 6,445,183 | B1 | * | 9/2002 | Shimizu et al. | 324/309 |
| 6,459,922 | B1 | * | 10/2002 | Zhang | 600/410 |
| 7,227,359 | B2 | | 6/2007 | Ma | |
| 7,800,367 | B2 | * | 9/2010 | Bhardwaj et al. | 324/309 |
| 8,030,924 | B2 | * | 10/2011 | Bito et al. | 324/312 |
| 8,143,890 | B2 | * | 3/2012 | Dong et al. | 324/309 |
| 8,527,031 | B2 | * | 9/2013 | Yu et al. | 600/410 |

OTHER PUBLICATIONS

"MR Susceptibility Misregistration Correction," Sumanaweera et al., IEEE Transactions on Medical Imaging, vol. 12, No. 2 (1993), pp. 251-259.

"Removing Background Phase Variations in Susceptibility-Weighted Imaging Using a Fast, Forward-Field Calculation," Neelavalli et al., Journal of Magnetic Resonance Imaging, vol. 29 (2009), pp. 937-948.

"Correction of Image Distortion in Echo Planar Image Series Using Phase and Intensity," Xu, Doctoral Dissertation, Vanderbilt University (2008).

"$k$-TE Generalized Autocalibrating Partially Parallel Acquisition (GRAPPA) for Accelerated Multiple Gradient-Recalled Echo (MGRE) $R_2$* Mapping in the Abdomen," Yin et al., Magnetic Resonance in Medicine, vol. 61 (2009) pp. 507-516.

(Continued)

*Primary Examiner* — Dixomara Vargas
(74) *Attorney, Agent, or Firm* — Schiff Hardin LLP

(57) ABSTRACT

In a method and system for phase-sensitive magnetic resonance imaging, a respective, complex image data set provided to a processor for each of at least two different echo times, the complex image data sets for the different echo times having been reconstructed from magnetic resonance data that acquired for the different echo times using an echo imaging sequence, at least one complex division image data set is determined in the processor by complex division of the complex image data sets for the two different echo times. The two different echo times define an echo time difference, so the resulting complex division image data set has phase components that are dependent on the echo time difference.

25 Claims, 6 Drawing Sheets

(56) References Cited

OTHER PUBLICATIONS

"Breath-Hold Water and Fat Imaging Using a Dual-Echo Two-Point Dixon Technique With an Efficient and Robust Phase-Correction Algorithm," Ma, Magnetic Resonance in Medicine, vol. 52 (2004) pp. 415-419.

"Combined Surface and Body Coil Imaging," Gross, Siemens AG (2009).

Information Theory, Inference, and Learning Algorithms, MacKay (2003), pp. 1-4 and 341-342.

\* cited by examiner

METHOD AND SYSTEM FOR PHASE-SENSITIVE MAGNETIC RESONANCE IMAGING

BACKGROUND OF THE INVENTION

1. Field of the Invention

The present invention concerns a method for phase-sensitive magnetic resonance imaging in which magnetic resonance data are acquired using an echo imaging sequence, as well as a magnetic resonance system for implementing such a method.

2. Description of the Prior Art

Magnetic resonance tomography (MRT) is an imaging modality that enables the acquisition of two-dimensional or three-dimensional image data sets that can depict structures inside an examination subject (even soft tissue) with high resolution. In MRT, protons in the examination subject are aligned in a basic magnetic field ($B_0$) so that a macroscopic magnetization (alignment) of the protons exists, and the protons are subsequently excited by the radiation of RF (radio-frequency) pulses. The decay of the excited magnetization is subsequently detected by means of one or more induction coils, and a spatial coding of the acquired signal is achieved by the switching (activation) of slice selection, phase coding and frequency coding gradients before or during the acquisition. The acquisition of the decay signals thereby regularly takes place with a quadrature detection so that both the phase and the amplitude of the signal are detected. The signals detected in positional frequency space (domain) (k-space) can accordingly be represented as complex numbers and can be transformed by means of a Fourier transformation into image space (domain), in which phases and magnitudes can now be determined with spatial resolution.

In many imaging methods, only the magnitude of the complex image data is used to create an intensity image. The phase information is discarded. Furthermore, a combination of the magnitude data that were acquired with different coils is not optimal with regard to the signal-to-noise ratio (SNR).

For example, in conventional T2* (observed spin-spin relaxation time) or R2* (01/T2*) imaging, the magnitudes of three or more images are considered that were acquired at different echo times (TEs) from an individual proton species (type) (for example by the use of fat suppression). The T2* time can subsequently be determined with spatial resolution by the adaptation of a decay function to the magnitudes in the image data. However, this approach is very time-consuming and correspondingly prone to movement artifacts.

Other imaging methods use the acquired phase information. For example, the differences of the magnetic susceptibility of different tissue lead to phase differences. In susceptibility-weighted imaging (SWI), an expanded contrast signal image is thereby generated from the acquired magnitude and phase information, which expanded contrast signal image in particular has a contrast dependent on the oxygen content of the blood. Additional examples generally include phase contrast imaging as well as proton resonance frequency (PRF) shift thermometry. In the latter, a shift of the phase in acquired phase images is detected that is caused by a shift of the proton resonance frequency due to a temperature change.

In addition to these phase shifts with information content, there is a series of effects that cause unwanted phase shifts that can conceal usable information. These effects include, among other things, an inhomogeneity of the static $B_0$ field, the susceptibility of articles and materials in proximity to the patient, phase shifts of the radiated RF pulses, and errors in the chronology of the acquisition sequence. Phase shifts that can be different for different reception coils can also occur in the acquisition chain.

These phase shifts make it difficult to compare and combine image data acquired at different echo times with one another. In particular, the combination of MR data acquired with different reception coils while acquiring phase information turns out to be difficult since each acquisition channel has a different phase shift. Objects within the examination subject—for example air bubbles, implants, needles or the like—can also lead to susceptibility artifacts, and thus also to phase shifts.

It is accordingly desirable to combine magnetic resonance (MR) data acquired for different echo times or with different coils so that the signal-to-noise ratio is improved and usable phase information is retained. In order to enable shorter scan durations, the acquisition method should also be capable of enabling such a combination for accelerated acquisition techniques and multi-echo imaging sequences. Moreover, the data should be able to be combined in a well-defined manner in order to be able to make reasonable conclusions about the images represented by the data acquired in such a manner.

A method known for R2* imaging is k-TE GRAPPA, which is described in detail in "k-TE Generalized Autocalibrating Partially Parallel Acquisition (GRAPPA) fur Accelerated Multiple Gradient-Recalled Echo (MGRE)R2* Mapping in the Abdomen", by Xiaoming Yin et al., Magnetic Resonance in Medicine 61:507-516 (2009) P. 507-516. The method uses a partially parallel imaging method (GRAPPA) in combination with a view-sharing method in which missing k-space lines in incompletely scanned k-space are reconstructed on the basis of k-space lines acquired with adjacent coils and temporally adjacent sequences. The result of the method is a series of images of different echo times (TE), wherein the image noise in the image data varies spatially due to the reconstruction process. How the acquired image data can be combined optimally with regard to SNR is not disclosed in this publication.

Given a combination of image data under consideration of the phase, in conventional methods the phases of adjacent image points are compared in order to produce a total phase estimation. Image points with large phase variation—for example in regions with low SNR or along tissue boundaries—can interfere with the phase correction method. Furthermore, methods are known from U.S. Pat. No. 7,227,359 (for example) that are based on phase gradients in the image data and that implement a region expansion (region growing) to determine the phases using a seed image point.

Given image data that were acquired with a multi-echo imaging sequence—for example with a single-shot or EPI (echoplanar imaging) sequence—a "characteristic" echo time is normally associated with the data. This characteristic TE is typically the TE with which central k-space lines were scanned. However, in such sequences, different spatial frequencies (k-space lines) are scanned using different TEs, such that these respectively contribute to an error in the reconstructed image data depending on the respective TE. The errors in the phase accordingly depend on the acquisition sequence and moreover have a spatial dependency, such that they can only be predicted with difficulty.

SUMMARY OF THE INVENTION

It is an object of the present invention to reduce at least a few of the aforementioned disadvantages and to provide an improved method for phase-sensitive MR imaging. In particular, an improved combination of image data for different coils and/or with different associated echo times should be enabled.

According to a first aspect of the invention, a method is provided for phase-sensitive magnetic resonance imaging. The method includes the provision of a respective, complex image data set for at least two different echo times, wherein the complex image data sets for the different echo times were reconstructed from magnetic resonance data that were acquired for the different echo times using an echo imaging sequence, and the determination of at least one complex division image data set by complex division of the complex image data sets for the two different echo times. The two different echo times thus define an echo time difference (ΔTE). The resulting complex division image data set has phase portions dependent on the echo time difference.

Through the division of the complex image data it is possible to eliminate phase shifts in the image data that are caused by effects independent of the echo time. Phase shifts due to echo time-dependent effects that can contain valuable information are thereby maintained. Since equivalent image data that are purged of echo time-independent phase effects can be obtained with the method for different echo times and/or coils, such image data can be combined in a simple and reproducible manner, with the relevant phase information being retained. The method can also includes the acquisition of the magnetic resonance data and the reconstruction of the complex image data sets.

In an embodiment, the complex division of the complex image data sets takes place such that phase and/or magnitude portions of the complex image data sets that are independent of the echo time are at least partially compensated in the at least one division image data set. These unwanted phase and/or magnitude portions can thus be at least partially removed in the complex division.

In another embodiment of the invention, a complex image data set is respectively provided for at least three different echo times. At least two complex division image data sets are determined via per-pair, complex division of the complex image data sets with different associated echo times. Each division image data set is thus formed from a pair of complex image data sets whose associated echo times have a defined echo time difference. A plurality of complex division image data sets can thus be defined that can subsequently be combined while maintaining the phase information.

The acquisition of MR data and the reconstruction of the complex image data sets can take place for different echo times that have a predetermined (in particular the same) echo time interval.

The complex division image data sets can be formed from those pairs of complex image data sets whose associated echo times have the same echo time difference. This ensures that the defined division image data sets are equivalent and have comparable phase shifts dependent on this echo time difference, such that the division image data sets can be combined in a simple manner. Temporally adjacent image data sets can be divided with regard to TE, but other combinations are also conceivable. For example, a series of echoes can be acquired with the echo time imaging sequence, for which echoes complex image data sets are reconstructed with different associated echo times. A complex division image data set can then be formed from two image data sets that both correspond to an even or odd echo number in the series. The combination of even and odd echoes can remove phase effects that can occur due to temporal workflow errors in the scanning of k-space. Such errors are known from EPI sequences, in which echoes that are acquired from left to right along the phase coding direction in k-space have a time shift in comparison to the echoes that were acquired from right to left. The resulting phase shift in image space can be removed via the cited division of image data belonging to the even or odd echoes, which is not possible given the division with regard to TE-adjacent image data.

In a further embodiment, the MR data were acquired with a coil array that has at least two coils, wherein for each coil a respective complex image data set is provided for at least two different echo times, which complex image data set was reconstructed from the acquired MR data. For each coil at least one complex division image data set can then be determined from the complex image data sets provided for the respective coil. Phase shifts that are caused by the individual coil sensitivity or the acquisition channel (reception chain) can be removed by the division of the image data sets acquired with a coil. Equivalent division image data sets that are no longer dependent on the local coil sensitivities can therefore be acquired for different coils. The method can thus enable the information of image data while preserving the phase information, even if this was acquired with different echo times and different coils.

In an embodiment, the method includes the step of combining data from at least two of the defined complex division image data sets. The combination thereby comprises every merger of the data, for example via complex combination or combination of real parts or of real variables defined from the division image data sets. Division image data sets for the same echo time difference are advantageously combined, whereby division image data sets for different echo times or different acquisition coils can be combined.

For example, at least one complex, combined division image data set can be created via complex combination of at least two of the defined complex division image data sets. Such a combination can improve the signal-to-noise ratio and simultaneously maintain the phase information since the complex division image data sets are equivalent. For example, complex division image data sets are combined that were determined for the same echo time difference from complex image data sets for the same echo time difference and/or that were determined for the same echo time difference for different coils.

In a further embodiment, the method includes the determination of a covariance matrix for each of the provided complex image data sets, which indicates a measure of the noise in the image data, and the determination of a covariance matrix for the complex division image data set from the covariance matrices for the respective complex image data sets from which the complex division image data set was determined. The combination of the image data sets by division thus enables an error estimation to be made for the resulting division image data sets. The determination of the covariance matrix for the division image data set can take place by means of (for example) a Laplace approximation, which is described in detail in "Information Theory, Inference, and Learing Algorithmus", by David J. C. MacKay, Chapter 27, Page 141.

The combination of the at least two complex division image data sets can then take place under consideration of the covariance matrices for these division image data sets. In the combination it is thus possible to weight regions with higher variances less in one division image data set than the corresponding regions in a different division image data set. The combination can thus take place such that the resulting variances of the combined image data are minimized.

For example, the image combination takes place by spatially resolved determination of a geometry factor (g-factor)

from the covariance matrices for each of the division image data sets to be combined, and by weighting of these division image data sets with the respective geometry factor in the combination. For example, a weighting with 1/g can take place. Higher values of the g-factor normally indicate a lower SNR of the image data in the corresponding region, such that these regions are correspondingly weighted less in the combination, whereby the SNR of the combined image data is improved.

The method can encompass the acquisition of the magnetic resonance data so that it is possible to configure the acquisition of the magnetic resonance data with regions with high variances or high geometry factors arranged at different spatial positions in the reconstructed image data sets for different echo times and/or for different coils. Given a combination of the image data sets by complex division, these regions consequently do not overlap, such that the variances in the division image data can be kept low. The acquisition advantageously takes place such that the regions of higher g-factors or larger variances are also arranged at different spatial positions in the division image data, whereby given the aforementioned combination of the division image data it is possible to even significantly reduce the variances in the resulting combined division image data.

The method is thus also suitable for accelerated acquisition methods, including partially parallel imaging methods such as GRAPPA or SENSE, in which the covariance matrices are to be accounted for in the reconstruction to improve the signal-to-noise ratio, and in which the reconstructed image data have regions with higher variances as well as correlations between image points.

A real phase $\phi$ (or a resonance frequency shift W under consideration of DTE) and/or a T2* relaxation time can subsequently be determined with spatial resolution for the associated echo time difference from the complex division image data set or the complex combined division image data set. A phase image and/or a T2* map thus can be determined. Since the division image data no longer contain the phase shifts independent of the echo time, and since an increase of the signal-to-noise ratio is furthermore possible by the combination of division image data, the phase and/or the T2* relaxation times can be determined with increased precision.

After the change of the phase for a specific echo time difference is known, an extrapolation of the complex image data sets (that were provided for different echo times) into a common echo time can furthermore take place using the defined real phase $\phi$ (or, respectively, the resonance frequency shift W) and the T2* relaxation time. Equivalent reconstructed image data sets can thus be obtained for an echo time. The extrapolated, complex image data sets can subsequently be combined, wherein the combination can in turn take place under consideration of a covariance matrix for the respective complex image data set. The combination of reconstructed image data sets for different echo times while maintaining the phase information is thus enabled, while the signal-to-noise ratio can be significantly improved in the combination.

In another embodiment, a real phase image that indicates the phase in the complex division image data set can be determined from said complex division image data set. The real phase images determined for different division image data sets can subsequently be combined. For example, this can take place via an averaging of the real phases, wherein here as well as a consideration of covariance matrices in the combination is conceivable.

Naturally it is possible to apply additional phase correction methods to the aforementioned phase images in order to remove remaining unwanted phase portions. A correction of phase jumps (phase unwrapping) can also take place in an additional step. However, the necessity for this can be reduced with the present method since such a correction is only necessary when a phase shift that is large enough to incur a phase unwrap (for example from −π to +π) takes place within the echo time difference. Given a complex combination of the complex division image data sets, the phase unwrapping can take place after this; given a combination of real phase images, the unwrapping advantageously takes place before the combining.

In one embodiment of the invention the provided complex image data sets were reconstructed from magnetic resonance data that were acquired with a multi-echo imaging sequence, for example a multi-GRE (Gradient Recalled Echo) sequence or with a segmented or single shot EPI (echoplanar imaging) imaging sequence. The echo time TE associated with a complex image data set can thereby be an equivalent echo time. The method can also comprise the implementation of such an imaging sequence for the acquisition of the MR data.

The provided complex image data sets can also have been acquired and reconstructed with a partially parallel imaging method, for example with a GRAPPA (Generalized Autocalibrating Partially Parallel Acquisition), SMASH (Simultaneous Acquisition of Spatial Harmonics) or SENSE (Sensitivity Encoding) imaging method. Even given such an accelerated acquisition of the MR data, with the method according to the invention a combination of the complex image data sets can take place while maintaining the phase information and with improvement of the signal-to-noise ratio.

In particular, the provided complex image data sets can have been acquired and reconstructed with a k-TE GRAPPA method. This delivers as a result a series of image data for different echo times TE for each coil. Even given higher acceleration factors, artifacts in the reconstructed image data can be reduced with the method given a marked shortening of the acquisition time.

The method can embody the cited acquisition or imaging sequences.

According to a further aspect of the present invention, a magnetic resonance system is provided that is designed to implement phase-sensitive imaging. The magnetic resonance system includes an acquisition unit that is designed to acquire magnetic resonance data for different echo times using an echo imaging sequence. Furthermore, a computer is provided that is designed (configured) to implement the following steps: reconstruct a respective complex image data set for at least two different echo times from magnetic resonance data acquired for different echo times, and determine at least one complex image data set via a complex division of the complex image data sets for the two different echo times. The two different echo times define an echo difference, so the resulting complex division image data set has phase portions dependent on the echo time difference. Advantages similar to those described in the preceding can be achieved with such a magnetic resonance system.

The magnetic resonance system is designed to implement any or all of the embodiments of the method described in the preceding. In particular, the computer can be designed such that it automatically executes one or more of the method steps described in the preceding.

The invention also encompasses a non-transitory, electronically readable data medium encoded with computer-readable control information, the control information being designed to cause a computerized control system of a magnetic resonance system, in which the storage medium is loaded, to implement one or more of the embodiments of the method described above Naturally, the features of the embodiments and aspects of the invention that are described in the preceding can be combined with one another. In particular, the features can be used not only in the described combinations but also in other combinations or taken separately without departing from the scope of the invention.

DESCRIPTION OF THE PREFERRED EMBODIMENTS

The present invention has the object of enabling a magnetic resonance (MR) imaging in which image data with high signal-to-noise ratio (SNR) are acquired while retaining relevant phase information. MR data at various echo times are acquired for this, and complex image data reconstructed from said MR data are divided by one another in order to remove echo time-independent phase effects. Equivalent division image data are thereby obtained that can be combined in a simple manner while retaining the phase information. Image data from various coils and for different echo times can thus be combined, wherein this procedure is applicable even when an accelerated acquisition method is used that does not scan the entirety of k-space for all echo times.

Insofar as the following refers to defined MR imaging sequences, it should be clear that sequences other than those cited can also be used insofar as the acquisition of MR data for different echo times is enabled. For example, the multi-echo imaging sequences cited in the following can also be replaced by other spin or gradient echo sequences with which image data for different TEs can be acquired.

Figure 1:
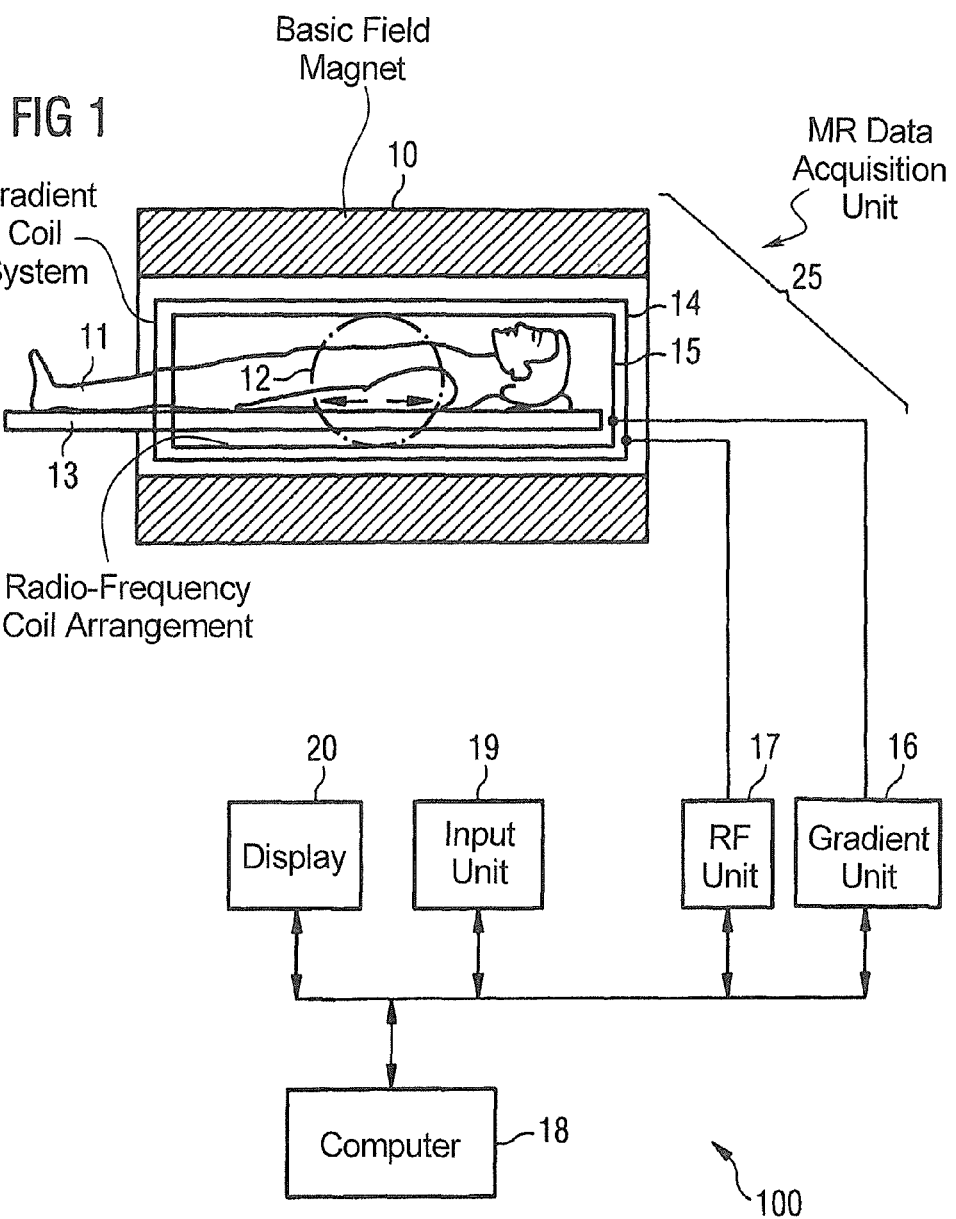
FIG. 1 is a schematic representation of a magnetic resonance system according to one embodiment of the present invention.

FIG. 1 schematically shows a magnetic resonance system according to one embodiment of the present invention. The MR system has a basic field magnet 10 to generate a polarization field B0. An examination subject—here a person 11 to be examined—can be slid on a recumbent table 13 into the magnet 10, as is schematically indicated by the arrow. The MR system furthermore has a gradient system 14 to generate magnetic field gradients that are used for the imaging and spatial coding. A radio-frequency coil arrangement 15 is provided to excite the polarization resulting in the basic magnetic field, which radio-frequency coil arrangement 15 radiates a radio-frequency field into the examined person 11 in order to deflect the magnetization out of the steady state. A gradient unit 17 is provided to control the magnetic field gradients and an RF unit 16 is provided to control the radiated RF pulses.

The acquisition of magnetic resonance signals from the examination region 12 can take place by means of the radio-frequency coil arrangement 15. In particular, given the implementation of an accelerated acquisition method (for example GRAPPA or SENSE) the magnetic resonance system can also have local reception coils or component coils (not shown). A larger coil array can also be provided that includes multiple reception coils. Additional spatial information is obtained due to the spatially independent arrangement of the coils, and thus the different sensitivity profiles. By a suitable combination of the magnetic resonance data acquired simultaneously by the coils an additional spatial coding can essentially be achieved so that k-space does not need to be completely scanned and an acceleration of the acquisition can be achieved. The reception coils of such a coil array can respectively have their own reception units so that a raw data set with MR data can be acquired in parallel for each reception coil. Partially parallel acquisition methods (partially parallel acquisition, PPA)—for example GRAPPA, SMASH or SENSE—for whose implementation the shown magnetic resonance system can be configured are known to those skilled in the art, such that additional details of these methods need not be described herein. The components of the magnetic resonance system—for example the units 14-17—that serve for the acquisition of MR data are designated as acquisition unit 25 in the following.

The magnetic resonance system is centrally controlled by the computer 18, which for this can include a control unit. For example, computer 18 thus controls the radiation of RF pulses and the acquisition of resulting MR signals. An operator can select a frequency protocol via an input unit 19 and input and modify imaging parameters that are displayed at a display 20.

The general functionality of an MR system is known to those skilled in the art, such that a more detailed description of the general components is omitted.

The computer 18 is configured in order to control the implementation of an echo imaging sequence. The computer 18 can be configured to implement spin echo or gradient echo imaging sequences. In particular, a multi-echo imaging sequence—for example an EPI sequence—can be implemented in which all k-space lines are scanned within a repetition time, i.e. in which a complete image data set is acquired after an excitation. A sequence of gradient echoes or spin echoes is thereby generated by the repeated switching of dephasing and rephasing gradients in the frequency coding or, respectively, phase coding direction (echo train). Additional sequences for which the computer 18 can be configured to implement include GRE (Gradient Recalled Echo), MGRE (Multiple Gradient Recalled Echo), PPA sequences (for example SENSE, GRAPPA or SMASH) and view sharing sequences in which k-space lines acquired at one echo time (TE) are used in the reconstruction of image data for adjacent TEs.

In a preferred embodiment, computer 18 is configured in order to execute the k-TE GRAPPA method described in "k-TE Generalized Autocalibrating Partially Parallel Acquisition (GRAPPA) for Accelerated Multiple Gradient-Recalled Echo (MGRE)R2* Mapping in the Abdomen", by Xiaoming Yin et al., Magnetic Resonance in Medicine 61:507-516 (2009). k-TE GRAPPA uses an MGRE acquisition sequence in which peripheral regions of k-space are only incompletely scanned. The positions of the scanned k-space lines are thereby varied periodically for different TEs, such that MR data for different k-space lines are present in the data sets for adjacent TEs. Central k-space lines are completely scanned for each echo time in order to enable the calculation of GRAPPA correlation coefficients. In k-TE GRAPPA missing k-space lines have thereby been acquired not only using adjacent k-space lines that were acquired with adjacent coils of the coil array but rather are also reconstructed using k-space lines for adjacent echo times. The result is complete image data sets for the different echo times and for the different coils that are used. Since the extension of missing k-space lines is also based on MR data for adjacent TEs that are acquired for the same k-space position, artifacts can be significantly reduced even given a high acceleration of the acquisition.

The computer 18 is furthermore designed to implement the reconstruction of image data sets for different TEs from the acquired MR data. Given simple acquisition methods, for example, this can take place via a two-dimensional Fourier transformation. Given k-space-based PPA acquisition methods, the computer 18 initially implements the determination of the missing k-space data, whereupon a conventional image reconstruction can take place.

The acquisition unit 25 is designed in order to detect the MR signals from the examination region 12 by means of a quadrature detection. The quadrature detection can be realized via demodulation of the acquired MR signal with the reference signal (RF field B1 radiated with wB1) and the reference signal phase-shifted by 90°, wherein the two signals that are thereby obtained are designated as real part and imaginary part of a complex RF signal. The MR data acquired in this manner upon scanning of k-space are thus complex data that comprise phase information. Given image reconstruction implemented by the computer 18, this phase information is retained, meaning that complex image data are determined. As in conventional methods, the computer 18 can determine a magnitude image ($\sqrt{(\text{real part}^2+\text{imaginary part}^2)}$) or a phase image (arctan(imaginary part/real part)) from these complex image data. The computer 18 is furthermore designed in order to combine complex image data (acquired for various TEs and/or with different reception coils) as is described in more detail in the following.

In order to combine the complex image data for different TEs and/or different coils while retaining the phase information, the computer 18 implements a complex division of the image data of a reception coil for different TEs. Furthermore, the computer 18 is designed to combine the complex division image data sets that result from this. From the division image data or the complex, combined division image data, the computer 18 can calculate a phase image and if necessary implement a correction of phase unwraps. Furthermore, the computer 18 can use conventional methods to remove unwanted phase portions in this phase image. The computer 18 can in particular be designed to implement each of the methods described in the following.

Additional components can be provided or components can be modified in other embodiments of the magnetic resonance system 100; for example, the computer 18 can be implemented as a separate computer and a separate control unit.

Figure 2:
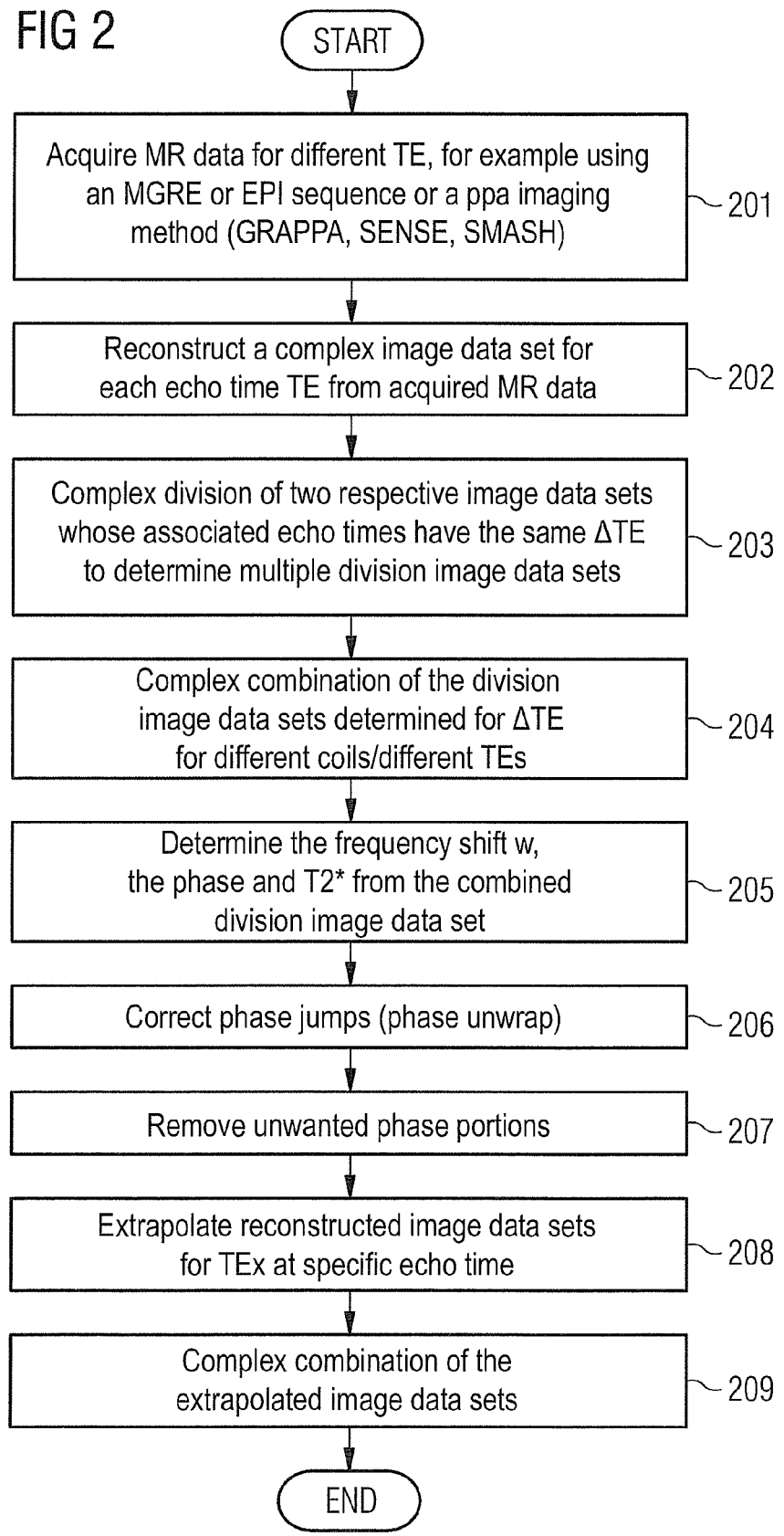
FIG. 2 is a flowchart that illustrates a method to combine complex image data sets according to one embodiment of the present invention.

FIG. 2 shows a flow chart of an embodiment of the method according to the invention that can be executed at the MR system shown in FIG. 1. In the first Step 201, the acquisition of MR data takes place for different echo times. This can take place with simple spin echo or gradient echo sequences, or with multi-echo imaging sequences, for example MGRE (Multiple Gradient Recalled Echo). In this sequence multiple echoes with different echo times are acquired following an excitation pulse, wherein an image data set is reconstructed for each echo time. The acquisition can also take place by means of an EPI or interleaved EPI sequence in which multiple k-space lines are read out following an excitation pulse. A contrast-defining equivalent echo time (TEeffective) that normally corresponds to the echo time at the readout of the central k-space lines is thereby assigned to the reconstructed image data. For example, multiple EPI sequences can be implemented for various equivalent echo times. Such sequences can also be used within the scope of a partially parallel acquisition, which is described in more detail in the following with reference to FIG. 4.

The reconstruction of a complex image data set from the acquired MR data takes place for each echo time TE in Step 202. The image data set can thereby comprise both 2D and 3D image data. The reconstruction can take place via Fourier transformation of the raw k-space data given simple imaging sequences. Given partially parallel acquisition methods, the reconstruction can initially take place by growing (expanding) the raw data in k-space and a subsequent Fourier transformation, or by anti-aliasing (unwrapping) the image data for different coils in image space. "More complex image data set" means that the image data set contains both magnitudes and phase information, this that a more complex value is assigned to each image point of the image data set, for example.

In the next Step 203 the complex image data sets for the various TEs are combined in that a complex division of two respective image data sets with the same $\Delta TE$ is implemented to determine multiple division image data sets. $\Delta TE$ designates the echo time difference between the echo times that are associated with the two image data sets to be divided. Complex division means that the complex values for image points that correspond are divided by one another. This means that the division takes place for each image point. Depending on whether they are 2D or 3D image data, image points can be pixels or voxels. In this embodiment there is thus no combination of real phases or real magnitudes that takes place. The image data with the larger associated echo time can be divided by the image data with the smaller associated echo time, or vice versa, wherein this takes place consistently for all acquired image data.

Figure 5:
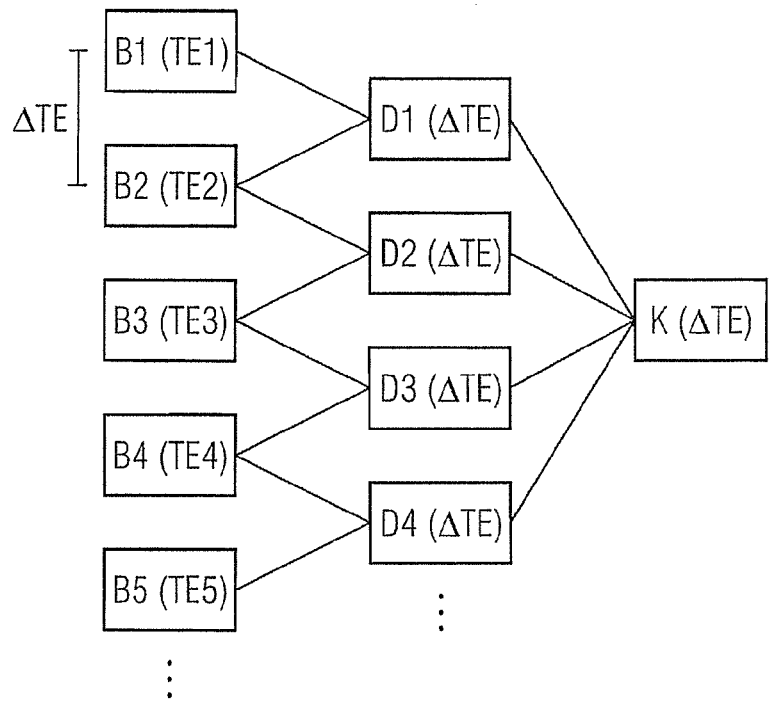
FIG. 5 schematically illustrates the combination of image data sets for different echo times.

Such a combination of the image data sets is illustrated as an example in FIG. 5. The complex image data sets acquired for different echo times TEx are identified with the reference characters B1-B5, wherein the echo times of adjacent image data sets respectively have a difference of $\Delta TE$. Temporally adjacent (with regard to TE) image data sets are divided in this example, whereby multiple complex division image data sets D1-D4 are respectively obtained for the same $\Delta TE$.

Figure 6:
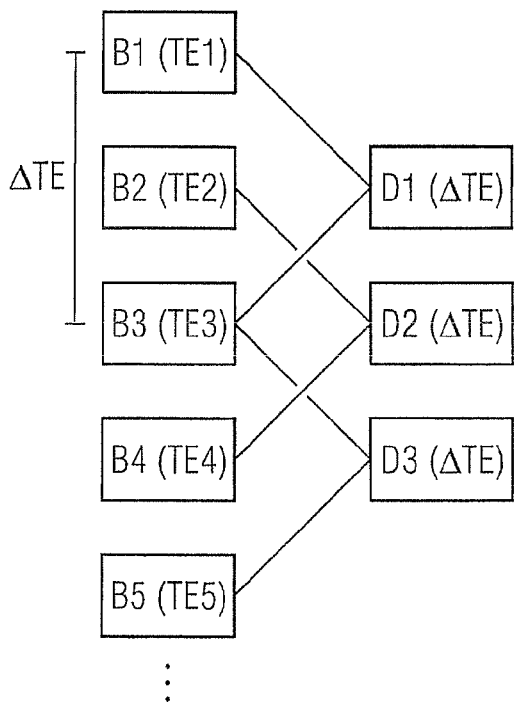
FIG. 6 schematically illustrates the combination of image data sets for even and odd echoes.

An additional preferred possibility for the combination of the complex image data sets via division is illustrated in FIG. 6. For example, phase effects can occur in EPI sequences due to errors over time. Echoes that are acquired from left to right along the phase coding direction in k-space can have a different time shift than echoes that are acquired from right to left, which leads to a phase shift in image space. This can be removed in the combined division image data sets since respective image data sets that were reconstructed from even or, respectively, odd echoes are divided. As illustrated in FIG. 6, the complex image data sets B1, B3, B5, . . . acquired with odd echoes are combined with one another, as are image data sets B2, B4, acquired at even echoes. The echo time difference $\Delta TE$ now corresponds to the difference in the echo times from the next but one neighbor in the order of the acquired image data sets.

TE-independent phase effects are removed via the division since these are present in both of the divided image data sets. The complex division image data sets accordingly have essentially TE-dependent phase portions. All division image data sets Dx correspond to the same ΔTE due to the division of the image data sets, meaning that they are equivalent and can be combined with one another in a simple manner.

The complex combination of the division image data sets determined for ΔTE now takes place in Step 204. In the simplest case, the complex combination can take place via an averaging of the complex values for corresponding pixels. In other embodiments—for example as described in the following with reference to FIG. 4—the combination of the division image data sets can take into account the noise in these data sets, for example by means of covariance matrices that were determined for the division image data sets.

Figure 7:
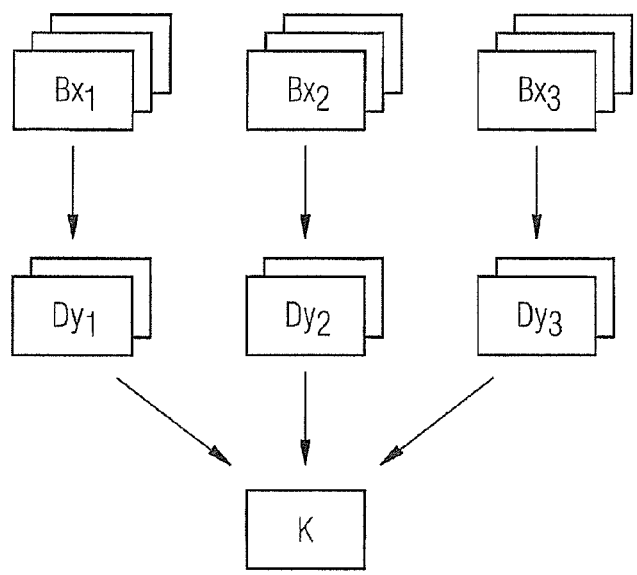
FIG. 7 schematically illustrates the combination of complex division image data sets that are acquired with different reception coils.

FIG. 5 illustrates the combination of the equivalent division image data sets D1-D4, wherein a more complex combined division image data set K is obtained. The division image data sets D1-D3 shown in FIG. 6 can naturally be similarly combined. Division image data sets that were determined from image data sets acquired with different reception coils can likewise be combined in this manner. This is illustrated in FIG. 7, which shows image data sets Bx1, Bx2 and Bx3 acquired with three different reception coils. x designates the index for the image data sets (for different echo times) acquired with the respective reception coil and y designates the index for the division image data sets determined from these (number of the data set). The coils can have different sensitivity profiles and the corresponding reception channels can cause different phase shifts. Since respective image data sets that were acquired with the same coil are divided, these effects are no longer present in the respective division image data (meaning that they were "divided out"). Dy1-Dy3 thus also represent equivalent division image data sets that can be combined in a simple manner as described in the preceding.

The combination of the image data acquired with different reception coils is in particular of interest for PPA imaging methods; however, it can be summed up as higher variances in regions of the image data that result due to the only-incomplete scanning of k-space. An SNR-optimized combination of such image data is described in the following with reference to FIGS. 4 and 8.

The phase φ and T2* for the associated echo time difference ΔTE are determined in Step 205 from the combined division image data set K. This takes place in a simple manner under the assumption that each image point (pixel or voxel) has a spin type and a local environment with a characteristic resonance frequency shift w and T2*, since the division image data are approximately proportional to $$\exp(-(iw+1/T2^*)\Delta TE).$$

Not only the phase φ=w·ΔTE, but also T2* can therefore be determined in a simple manner.

Since the TE-independent phase portions have been removed and since the combined division image data are based on a plurality of acquired image data sets, a precise and reliable determination of φ and T2* can take place.

The correction of phase jumps (discontinuities) can optionally take place in Step 206 (phase unwrap). Such a correction is reasonable when resonance shifts or other TE-dependent phase effects are large enough in order to cause a shearing or jumping of the phase (for example from −π to +π) within the echo time difference ΔTE. Methods with which phase jumps in phase images can be corrected are well known and need not be explained in detail herein.

Furthermore, unwanted phase portions can be removed from the phase image in Step 207, for example via harmonic modeling.

The result of the method up to this Step is precise estimations of w and T2*, as well as a phase image in which the harmonic phases are removed. However, the originally acquired complex image data sets can also be combined advantageously with the aid of the phase information determined for ΔTE.

For this purpose, in Step 208 the complex image data sets reconstructed for different echo times TEx are extrapolated using the phase determined for ΔTE and T2* at a defined echo time TE. This means that how the image data acquired for TEx appear for the predetermined echo time TE is estimated using the now-known development of the phase and the magnitude of the complex image data in the time ΔTE. The reconstructed image data sets are thus "extrapolated" or "converted" into the predetermined TE. This can take place via scaling of the magnitudes in the image data sets according to the T2* determined for ΔTE and by shifting the phase according to the characteristic phase shift determined for ΔTE. Complex equivalent image data for the predetermined echo time TE can thus be determined.

These are subsequently combined in Step 209, wherein the combination can in turn take place by averaging the complex values for corresponding pixels from the different image data sets. The method thus delivers as an additional result a combined image data set in which the acquired image data are merged in a reasonable manner, wherein the signal-to-noise ratio is improved and the phase information is retained.

Figure 3:
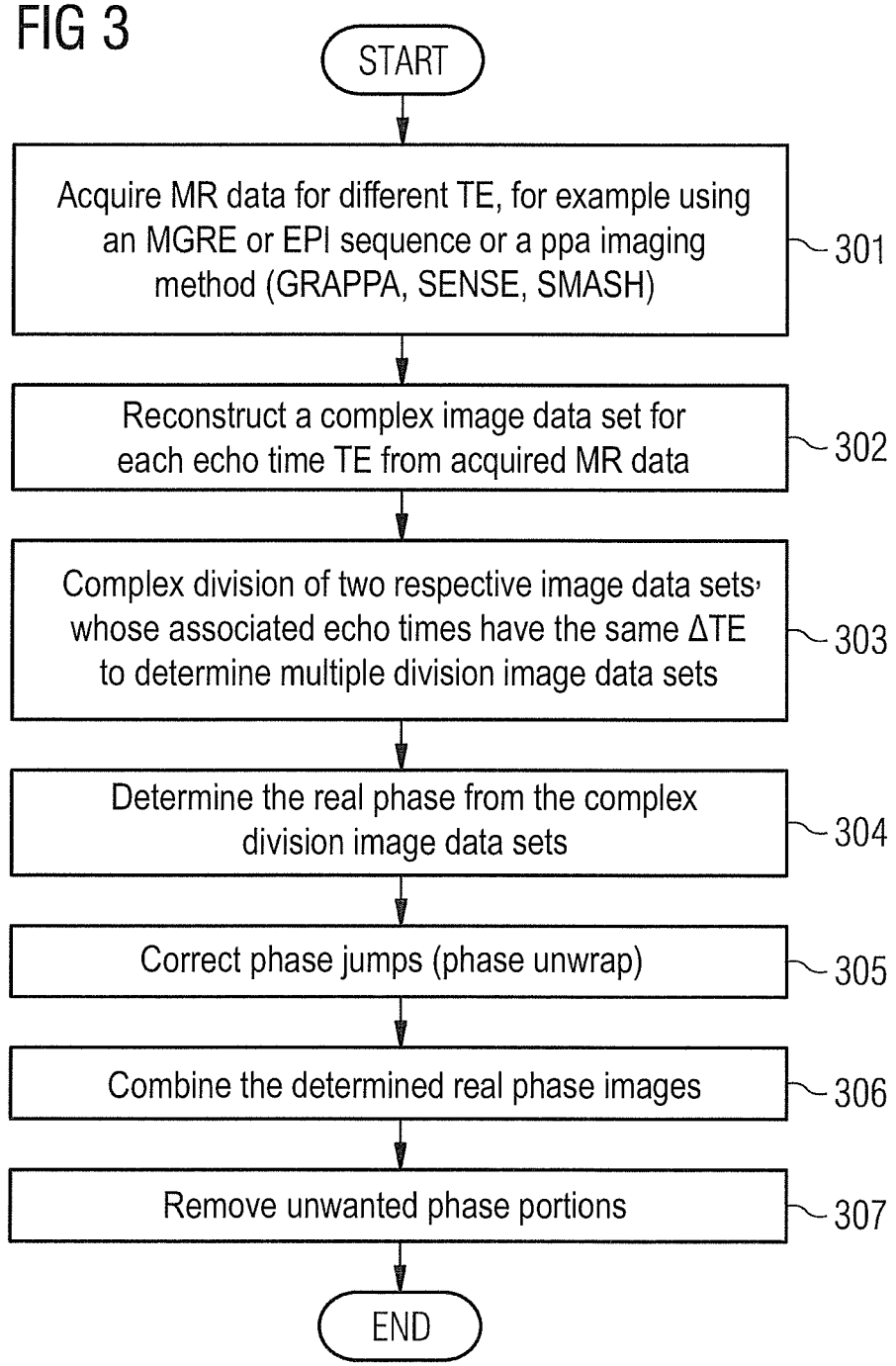
FIG. 3 is a flowchart that illustrates an additional embodiment of the method according to the invention.

FIG. 3 shows the flowchart of an additional embodiment of the method according to the invention that is a modification of the embodiment shown in FIG. 2. As in the method of FIG. 2, the acquisition of MR data in Step 301 and the reconstruction of complex image data sets for different echo times TE (Step 302) take place initially. As in Step 203, a complex division of two respective image data sets is implemented in Step 303 so that multiple division image data sets are obtained for the same ΔTE.

What is different than in FIG. 2 is that the determination of the real phase from the complex division image data sets now takes place in Step 304. The phase can be determined in a conventional manner, for example via calculation of the arctan (imaginary part/real part) of the complex values for the image points (pixels or voxels) of the division image data sets. A real phase image is thus obtained for each division image data set. Optionally, the correction of phase jumps (phase unwrapping) in these phase images determined in such a manner can again take place in Step 305.

The real phase images are subsequently combined in Step 306. Since the phase images here were also determined equivalently for ΔTE due to the preceding division, the combination can take place via a simple averaging of the real phases. The precision of the determination of TE-dependent phase portions can thus be significantly improved.

As was already described with reference to FIG. 2, unwanted phase portions can be removed in Step 306, for example via harmonic modeling. The method of FIG. 3 thus delivers as a result an estimation of the resonance frequency shift w and a combined phase image in which the harmonic phases are removed.

The methods described in the preceding with reference to FIGS. 2 and 3 can naturally include additional Steps; a combination of the methods is also conceivable. Both embodiments are based on the fact that the image data acquired for different TEs are converted into a series of equivalent ΔTE division image data, whereby TE-dependent phase portions are removed, so the image data can be combined in a simple manner.

Figure 4:
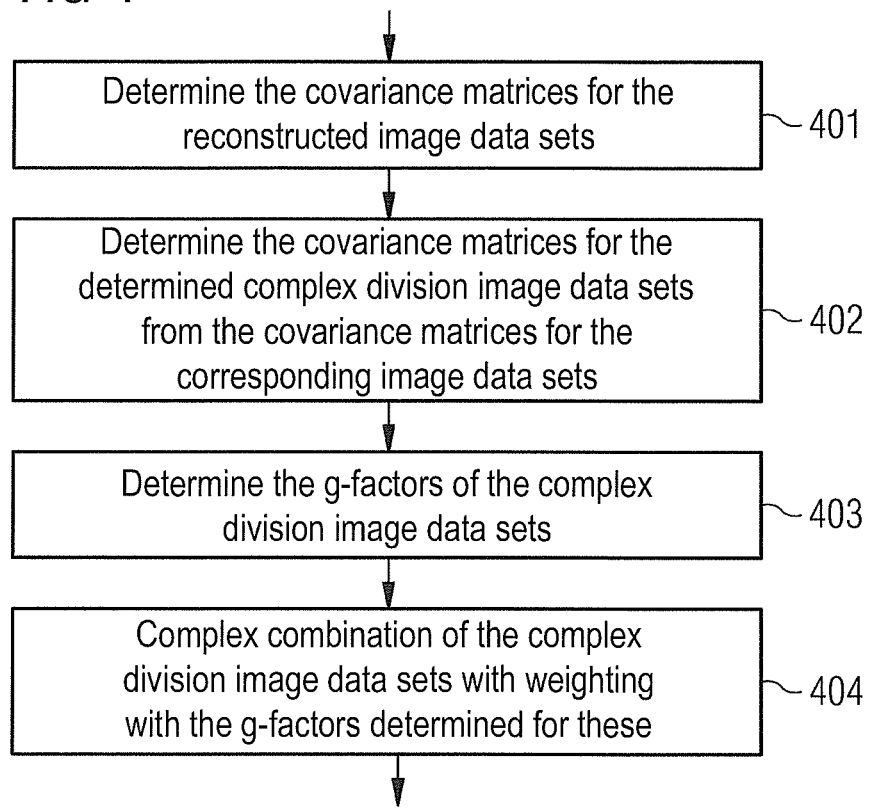
FIG. 4 is a flowchart with method steps for complex combination of diffusion image data sets which can be used at Step 204 of FIG. 2.

FIG. 4 illustrates a preferred embodiment of a method for complex combination of the division image data sets that is applicable in the method of FIG. 2. However, with corresponding modifications the method can also be used for combination of the extrapolated image data sets (Step 209 in FIG. 2) or for combination of the real phase images (Step 306 of FIG. 3). The method is particularly suitable for accelerated PPA imaging methods since image noise and correlations to improve the SNR should be taken into account in these. However, it is also usable in other acquisition methods.

The determination of the covariance matrices V for the reconstructed image data sets takes place in Step 401. The covariances can be determined in a conventional manner for simple acquisition methods and for PPA methods. In Step 402 the covariance matrices for the determined complex division image data sets are subsequently determined from the covariance matrices for the corresponding image data sets. An approximation of the image noise in the division image data sets can take place based on a Laplace approximation. This is described in detail in "Information Theory, Inference, and Learing Algorithms", by David J. C. MacKay, Cambridge University Press, Version 6.0/2003, Chapter 27, Page 341 and the following. A complex division image data set that is stored in (represented as) a vector z is, for example, obtained by division of a first complex image data set (whose values are stored in a vector x and that has Gaussian image noise (average value of zero and covariance matrix V)) by a second complex image data set (that is stored in a vector y and that likewise has Gaussian image noise (average value equal to zero and covariance matrix W)):

$$z_n = x_n / y_n$$

The covariance matrix U of the resulting complex division image data can then be calculated as follows:

$$[U^{-1}]_{nm} = y_n^* y_m ([V^{-1}]_{nm} + [W^{-1}]_{nm}(y_n^* y_m)(x_n^* x_m)),$$

wherein $-1$ indicates the inverse of the matrix and $*$ indicates the complex conjugate of the matrix, and wherein indices designate vector or matrix elements.

The covariances determined in such a manner can be taken into account in the complex combination of the division image data sets (Step 204 of FIG. 2). If k-space is scanned differently for different echo times, or if different reception coils are used, equivalent division image data sets are in fact obtained with the division of the image data, which equivalent division image data sets can, however, have a different image noise. Given the combination of the division image data sets this can be taken into account in that regions with higher image noise are weighted less in the combination. The signal-to-noise ratio can be significantly improved via such a controlled combination of the image data.

Given the use of multiple reception coils, the g-factors for the complex division image data sets can be estimated from the corresponding covariance matrices (for example in Step 403). The determination of the geometry factor from the sensitivity matrices of the coils and the corresponding covariance matrices is known from the prior art and does not need to be described in detail here. In the complex combination of the division image data sets (Step 404) a weighting with the g-factors determined for these (for example with 1/g) can then take place. Regions with high g-factors indicate greater image noise, and therefore a lower precision of the image data acquired for the corresponding region. These regions are weighted less via the described method, such that the precision and the SNR are improved in the combined image data in the region.

Figure 8A:
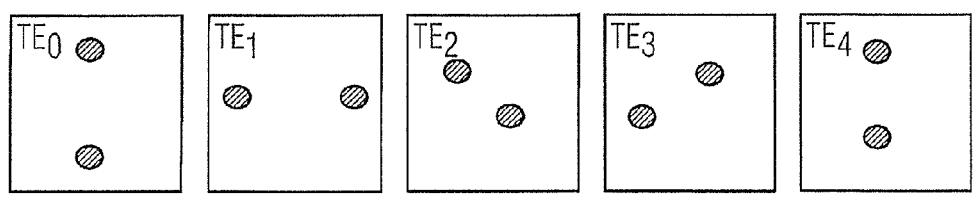
FIGS. 8A and 8B illustrate the spatial attitude of regions with high g-factors in image data for different echo times and in division image data determined therefrom.
Figure 8B:
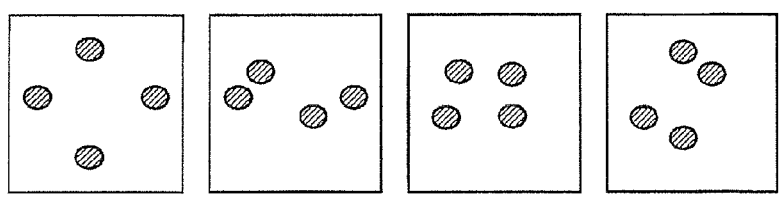

It is particularly advantageous when the positions of the regions with high g-factor are shifted counter to one another in the image data for different TEs by an appropriate selection of the k-space acquisition scheme. This is illustrated as an example in FIGS. 8A and 8B. FIG. 8A shows a series of image data for different TEs in which regions of high g-factors are marked in black. Since the regions of higher g-factors are shifted counter to one another in the various image data, these do not overlap in the resulting division image data sets that are shown in FIG. 8B. Furthermore, from FIG. 8B it is clear that the k-space acquisition scheme is configured such that, in the division image data sets, there is no region that has a high g-factor in each division image data set. Give a combination of the shown division image data sets with a corresponding weighting, the image noise in the resulting combined division image data can thus be significantly reduced.

Even given the use of a partially parallel imaging method, image data of different coils that still have a few image artifacts can thus be reasonably combined. The determination of the variance matrices and of w and $T2^*$ is presented in detail in the following for the example of a partially parallel acquisition sequence.

It is initially assumed that complete image data have been acquired for each echo time (index m). The image points in these image data are then dependent on B1+ and B1− (wherein both contain TE-independent phase shifts), the contrast "p" (depending on T1, the proton density etc.) that is characteristic of the acquisition sequence and the following TE-dependent components: phase shifts due to a resonance shift with the angular frequency "w" and the $T2^*$ decay. The k-space signal for a defined echo time m can then be specified as:

$$s_m = F T B1^+ B1^- p \operatorname{Exp}(-(i^* w + 1/T2^*) T E_m) + n,$$

wherein FT indicates the Fourier transform, and wherein n is a noise vector with the covariance matrix V. The k-space signal s spans k-space and can be acquired with different reception coils (indices are not indicated here for the sake of clarity).

If k-space is now only incompletely scanned, this can be represented with a reduction matrix R:

$$s_m = R F T B1^+ B1^- p \operatorname{Exp}(-(i^* w + 1/T2^*) T E_m) + n',$$

wherein the reduced noise vector n' and the corresponding covariance matrix are, respectively, $$n' = Rn, \text{ and}$$

$$\operatorname{variance}(n') = R V R t$$

Even given an incomplete scan, complete image data can be reconstructed with a method such as GRAPPA, SMASH or SENSE; however, these regions have higher variance (or, respectively, a higher g-factor) and higher correlations between the image points (pixels or voxels). The statistical information that are contained in these data are not lost due to the determination and pursuit of these correlations. As presented in the preceding, image data that have different covariance matrices can be combined in a suitable manner so that, for example, problems with higher g-factors in the individual image data can be avoided via the combination.

The calculation of a covariance matrix for a reconstructed image data set am is known and can take place independent of whether GRAPPA, SMASH, SENSE or another reconstruction method is used to generate the complete image data set.

Such methods can use the conditioning of inverses, prior information etc. Moreover, such methods can use data from data sets already in the reconstruction, which data sets were acquired for adjacent TEs. For example, in the k-TE GRAPPA method—described in "k-TE Generalized Autocalibrating Partially Parallel Acquisition (GRAPPA) fur Accelerated Multiple Gradient-Recalled Echo (MGRE)R2* Mapping in the Abdomen", von Xiaoming Yin et al., Magnetic Resonance in Medicine 61:507-516 (2009)—in which the k-space data are completed using k-space lines that were acquired in a preceding or subsequent echo time. Even for iterative methods it can be possible to determine a linear transformation between the original data and the reconstructed image data. With a transformation matrix W (that, for example, can be a GRAPPA operator) a reconstructed image data set can be determined as $$am = WRsm$$

wherein the variance of am is calculated as $$\text{variance}(am) = WRVRtWt$$

When the echoes are acquired with the same echo time intervals (i.e. at regular intervals with a width $\Delta TE$), this equation can then be simplified as follows for successive echoes:

$$TEm = m\Delta TE + TE0$$

$$a_m = a_{m-1} \text{Exp}(-(i^*w + 1/T2^*)\Delta TE) + n'_m + n'_{m-1}$$

$$a_m/a_{m-1} = \text{Exp}(-(i^*w + 1/T2^*)\Delta TE) + n''_m$$

This simple relationship applies to pairs of successive echoes. From this equation it is clear that an estimation of the resonance frequency shift w (via determination of the phase $\phi = w \cdot \Delta TE$ in the division image data) and of the T2* relaxation time (by determining the magnitude in the division image data) is possible in a simple manner from the division of two image data sets am and am-1. Given the acquisition of image data for M different echo items, M-1 estimations are therefore possible. As explained in the preceding, a covariance matrix for the corresponding division image data can be determined from the covariance matrices for the image data am and am-1. Not only is the estimation of M-1 real phase images possible as described with reference to FIG. 3, but also the complex combination of the division image data sets under consideration of the covariance matrices defined for these data sets.

Through the use of the cited error estimation methods for determination of the noise vectors and their covariances for the acquired image data sets, and through the estimation of the covariance matrices for the division image data sets, the quality of the image data in these can be assessed so that the combination of the image data of different coils, while improving the SNR, is enabled via the method, even given the cited accelerated acquisition methods in which the image noise for different regions can vary significantly.

Embodiments of the present invention thus provide equivalent division id s that enable a simple combination of MR data acquired for different echo times and with different coils. Moreover, the estimation of the image noise and of the covariance matrices for the division image data enables an SNR-optimized combination of said division image data. The method can in particular be applied to image data acquired with accelerated imaging methods. Furthermore, by the determination of the TE-dependent parameters (in particular w and TE2*) it is possible to convert image data sets acquired at different TE into a desired TE so that the acquired image data sets can be combined with one another in a meaningful manner.

Although modifications and changes may be suggested by those skilled in the art, it is the intention of the inventor to embody within the patent warranted hereon all changes and modifications as reasonably and properly come within the scope of his contribution to the art.

We claim as our invention:

1. A method for phase-sensitive magnetic resonance imaging, comprising:

to a computerized processor, providing respective complex image data sets for at least two different echo times in a magnetic resonance echo imaging sequence, the respective complex image data sets for the different echo times being reconstructed from magnetic resonance data acquired respectively during the different echo times in said echo imaging sequence;

in said processor, automatically determining at least one complex division image data set by complex division of the respective complex image data sets for the two different echo times, said two different echo times defining an echo time difference, and said at least one complex division image data set having phase components dependent on said echo time difference; and making said at least one complex division image data set available at an output of said processor in a form for further processing.

2. A method claimed in claim 1 comprising implementing said complex division of the respective complex image data sets in said processor using an algorithm that at least partially compensates, in said at least one complex division image data set, at least one image component of the respective complex image data sets selected from the group consisting of phase components that are independent of said echo time and magnitude components that are independent of said echo time.

3. A method as claimed in claim 1 comprising providing, to said processor, a respective complex image data set for each at least three different echo times and, in said processor, implementing complex division of respective pairs of said complex image data sets, to obtain at least two complex division image data sets.

4. A method as claimed in claim 1 comprising implementing said echo imaging sequence to obtain said respective complex image data sets for said at least two different echo times, and implementing said echo imaging sequence with a series of echo times that includes echoes having an even echo number in said series and echoes having an odd echo number in said series and, in said processor, implementing said complex division only for complex image data sets that were both acquired with an even echo number in said series, or where both acquired with an odd echo number in said series.

5. A method as claimed in claim 1 comprising implementing said echo imaging sequence to acquire said complex image data sets, and implementing said echo imaging sequence using a magnetic resonance data acquisition device comprising a coil array that includes at least two coils, and acquiring the respective complex image data sets with said at least two different echo times respectively from said at least two coils.

6. A method as claimed in claim 1 comprising providing, to said processor, a respective complex image data set for each at least three different echo times and, in said processor, implementing complex division of respective pairs of said complex image data sets, to obtain at least two complex division image data sets, and implementing said complex division in said processor only of respective complex image data sets having associated echo times with a same echo time difference.

7. A method as claimed in claim 1 comprising providing, to said processor, a respective complex image data set for each at least three different echo times and, in said processor, implementing complex division of respective pairs of said complex image data sets, to obtain at least two complex division image data sets, and in said processor, implementing said further processing by combining at least two of said complex division image data sets.

8. A method as claimed in claim 1 comprising implementing said further processing by generating at least one complex, combined division data set by a complex combination of at least two of said complex division image data sets.

9. A method as claimed in claim 8 comprising combining said at least two of said complex division image data sets for a same echo time difference, from respective complex image data sets having different echo times.

10. A method as claimed in claim 1 comprising implementing said echo imaging sequence to acquire said complex image data sets, and implementing said echo imaging sequence using a magnetic resonance data acquisition device comprising a coil array that includes at least two coils, and acquiring the respective complex image data sets with said at least two different echo times respectively from said at least two coils, and implementing said further processing in said processor by combining respective complex division image data sets for a same echo time difference respectively acquired using different coils, among said at least two coils.

11. A method as claimed in claim 1 comprising, in said processor:
   automatically determining a covariance matrix for each of said complex image data sets that represents a measure of noise in image data in the respective complex image data set; and
   automatically determining a covariance matrix for said complex division image data set from the respective covariance matrices of the complex image data sets used to generate said complex division image data set.

12. A method as claimed in claim 11 comprising generating at least two complex division image data sets by complex division of said respective complex image data sets, and combining said at least two complex division image data sets dependent on the respective covariance matrices of the respective complex division image data sets.

13. A method as claimed in claim 12 comprising combining said at least two complex division data sets by determining a geometry factor from the respective covariance matrices thereof, and weighting the respective complex division image data sets with the respective geometry factor when combining the respective complex division image data sets.

14. A method as claimed in claim 1 comprising implementing said echo imaging sequence in a magnetic resonance data acquisition device to acquire magnetic resonance data from which the respective complex image data sets for at least two different echo times are reconstructed, and operating said magnetic resonance data acquisition device to acquire said magnetic resonance data with regions of high variances or high geometry factors at respectively different spatial positions in the reconstructed complex image data sets for said different echo times.

15. A method as claimed in claim 14 comprising acquiring said magnetic resonance data with a magnetic resonance data acquisition unit that comprises a plurality of respectively different reception coils, and operating said magnetic resonance data acquisition unit to acquire said magnetic resonance data with high variances or high frequency factors at different spatial positions for respectively different coils among said plurality of coils.

16. A method as claimed in claim 1 comprising, in said processor, implementing said further processing to determine at least one of a real phase or a $T2^*$ relaxation time, with spatial resolution, for an associated echo time difference obtained from the at least one complex division image data set.

17. A method as claimed in claim 16 comprising, in said processor, automatically extrapolating the complex image data sets for respectively different echo times, at a common echo time, using said real phase or said $T2^*$ relaxation time.

18. A method as claimed in claim 17 comprising, in said processor, determining a covariance matrix for each of said complex image data sets, and combining respective extrapolated complex image data sets dependent on the respective co-variance matrices thereof.

19. A method as claimed in claim 1 comprising implementing said further processing of said at least one complex division image data set to identify a phase therein, and determining a real phase image for each division image data set and combining said real phase images.

20. A method as claimed in claim 1 comprising reconstructing said respective complex image data sets from magnetic resonance data acquired using an echo imaging sequence selected from the group consisting of a multi-echo imaging sequence, a multi-GRE imaging sequence, a segmented EPI imaging sequence, and a single-shot EPI imaging sequence.

21. A method as claimed in claim 1 comprising reconstructing said complex image data sets from magnetic resonance data acquired with said echo imaging sequence, using a partially parallel imaging method.

22. A method as claimed in claim 21 comprising selecting said partially parallel imaging method from the group consisting of GRAPPA, SMASH and SENSE.

23. A method as claimed in claim 21 comprising acquiring and reconstructing said complex image data sets using a k-TE GRAPPA method.

24. A magnetic resonance system for phase-sensitive magnetic resonance imaging, comprising:
   a magnetic resonance data acquisition unit configured to reconstruct respective complex image data sets from magnetic resonance data obtained during at least two different echo times in a magnetic resonance echo imaging sequence;
   a processor supplied with said respective complex image data sets, said processor being configured to automatically determine at least one complex division image data set by complex division of the respective complex image data sets for the two different echo times, said two different echo times defining an echo time difference, and said at least one complex division image data set having phase components dependent on said echo time difference; and
   said processor being configured to make said at least one complex division image data set available at an output of said processor in a form for further processing.

25. A non-transitory, computer-readable storage medium encoded with programming instructions, said storage medium being loaded into a control and evaluation computer system of a magnetic resonance imaging system, and said programming instructions causing said control and evaluation computer system to:
   receive respective complex image data sets for at least two different echo times in a magnetic resonance echo imaging sequence, the respective complex image data sets for the different echo times being reconstructed from magnetic resonance data acquired respectively during the different echo times in said echo imaging sequence;

automatically determine at least one complex division image data set by complex division of the respective complex image data sets for the two different echo times, said two different echo times defining an echo time difference, and said at least one complex division image data set having phase components dependent on said echo time difference; and make said at least one complex division image data set available at an output of said processor in a form for further processing.

* * * * *